United States Patent
Takeuchi et al.

(10) Patent No.: US 12,477,682 B2
(45) Date of Patent: Nov. 18, 2025

(54) COOLING DEVICE

(71) Applicant: KABUSHIKI KAISHA TOYOTA JIDOSHOKKI, Kariya (JP)

(72) Inventors: Takashi Takeuchi, Kariya (JP); Masahiro Ichigo, Kariya (JP); Koki Nagae, Kariya (JP); Akihiko Nagae, Kariya (JP); Takamitsu Kozawa, Kariya (JP); Yoshiaki Oshita, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 205 days.

(21) Appl. No.: 17/981,602

(22) Filed: Nov. 7, 2022

(65) Prior Publication Data
US 2023/0240038 A1   Jul. 27, 2023

(30) Foreign Application Priority Data

Jan. 21, 2022 (JP) .................. 2022-007675

(51) Int. Cl.
    *H05K 7/20* (2006.01)
(52) U.S. Cl.
    CPC ................ *H05K 7/20154* (2013.01)
(58) Field of Classification Search
    CPC ................................. H05K 7/20154
    USPC ........................... 165/80.3, 104.33
    See application file for complete search history.

(56) References Cited

U.S. PATENT DOCUMENTS

| 7,355,851 B2* | 4/2008 | Lanni ............... H05K 7/20136 361/695 |
| 8,355,253 B2* | 1/2013 | Chen ............... H01L 23/427 165/104.33 |
| 2002/0186532 A1* | 12/2002 | Tomioka ........... H05K 7/20154 361/679.48 |
| 2023/0076448 A1 | 3/2023 | Ito et al. |

FOREIGN PATENT DOCUMENTS

| JP | 2017-011235 A | 1/2017 |
| JP | 2021-106200 A | 7/2021 |

* cited by examiner

*Primary Examiner* — Joel M Attey
(74) *Attorney, Agent, or Firm* — Sughrue Mion, PLLC

(57) ABSTRACT

A cooling device includes an upper flat plate-shaped member and a lower flat plate-shaped member disposed with a predetermined interval therebetween, a heat radiation fin configured to extend from the upper flat plate-shaped member toward the lower flat plate-shaped member and to form a flow path through which air flows between the upper flat plate-shaped member and the lower flat plate-shaped member, and a centrifugal fan having an inlet as an opening and an outlet configured to be open in a direction intersecting an opening direction of the inlet, wherein the centrifugal fan is disposed at a position separated from the upper flat plate-shaped member by a predetermined interval so that the outlet is open toward the flow path, and a protruding part that protrudes toward the centrifugal fan is provided on the upper flat plate-shaped member.

12 Claims, 4 Drawing Sheets

COOLING DEVICE

TECHNICAL FIELD

The present disclosure relates to a cooling device.

BACKGROUND

As a conventional cooling device, for example, there is a technology described in Japanese Unexamined Patent Publication No. 2017-11235. The cooling device described in the patent document includes a circuit structure and a cover that covers the circuit structure. The circuit structure includes a heat sink that dissipates heat generated by a circuit part, and a centrifugal fan that is a cooling fan for blowing air to the heat sink. The heat sink has a plate-shaped bottom surface portion and heat radiation fins that protrude from the bottom surface portion in a plate shape. The centrifugal fan is fixed to the bottom surface portion.

SUMMARY

In the heat sink of the cooling device using a general centrifugal fan, an air flow path is formed between a pair of flat plate-shaped members, for example, by heat radiation fins that extend from one flat plate-shaped member to the other flat plate-shaped member. Then, the air flowing out of the centrifugal fan flows through the flow path to perform cooling. On the other hand, it is desired to miniaturize the cooling device. In the cooling device using the centrifugal fan, there is a method of realizing miniaturization of the cooling device using a centrifugal fan having a short axial length.

However, when a centrifugal fan having a short axial length of the centrifugal fan is used, a large gap may occur between the centrifugal fan and the flat plate-shaped member when the centrifugal fan is fixed to the heat sink. In this case, when some of air enters the gap between the centrifugal fan and the flat plate-shaped member, the air circulates inside the heat sink, and an amount of air flowing through the flow path decreases. Therefore, the cooling capacity of the cooling device is reduced. In order to solve such problems and to realize miniaturization of the cooling device, it is conceivable to select a centrifugal fan with a size that matches a size of the heat sink, but it is very difficult to select a centrifugal fan with an appropriate size for each of heat sinks.

An object of the present disclosure is to provide a cooling device capable of improving cooling capacity while facilitating selection of a centrifugal fan.

Solution to Problem

A cooling device according to an aspect of the present disclosure includes a first flat plate-shaped member and a second flat plate-shaped member disposed with a predetermined interval therebetween, a heat radiation fin configured to extend from the first flat plate-shaped member toward the second flat plate-shaped member and to form a flow path through which air flows between the first flat plate-shaped member and the second flat plate-shaped member, and a centrifugal fan having an inlet as an opening and an outlet configured to be open in a direction intersecting an opening direction of the inlet, wherein the centrifugal fan is disposed at a position separated from at least one of the first flat plate-shaped member and the second flat plate-shaped member by a predetermined interval so that the outlet is open toward the flow path, and a protruding part that protrudes toward the centrifugal fan is provided on at least one of the first flat plate-shaped member and the second flat plate-shaped member that is farther from the centrifugal fan.

In such a cooling device, air is taken into the inside of the centrifugal fan from the inlet and is discharged from the outlet. The cooling device is cooled by the air discharged from the outlet of the centrifugal fan flowing through the flow path formed by the heat radiation fin. The protruding part that protrudes toward the centrifugal fan is provided on at least one of the first flat plate-shaped member and the second flat plate-shaped member that is farther from the centrifugal fan. Therefore, a gap between the at least one of the first flat plate-shaped member and the second flat plate-shaped member that is farther from the centrifugal fan and the centrifugal fan is narrowed by the protruding part. The air flowing out of the outlet of the centrifugal fan is less likely to enter the gap between one of the first flat plate-shaped member and the second flat plate-shaped member that is farther from the centrifugal fan and the centrifugal fan. Therefore, circulation of air in the cooling device is suppressed, and an amount of air flowing through the flow path and a flow rate of air increase. Therefore, even when a length of the centrifugal fan in the axial direction is short, the cooling device can be efficiently cooled. Thus, the centrifugal fan can be easily selected, and cooling capacity of the cooling device is improved.

The protruding part may be provided on the first flat plate-shaped member. In such a configuration, the air flowing out of the outlet of the centrifugal fan is less likely to enter the gap between the centrifugal fan and the first flat plate-shaped member.

The centrifugal fan may be mounted on the second flat plate-shaped member. In such a configuration, while the centrifugal fan can be easily mounted, the centrifugal fan can be disposed between the first flat plate-shaped member and the second flat plate-shaped member.

The protruding part may be provided on the second flat plate-shaped member. In such a configuration, the air flowing out of the outlet of the centrifugal fan is less likely to enter the gap between the centrifugal fan and the second flat plate-shaped member.

The centrifugal fan may be mounted on the protruding part. In such a configuration, while the centrifugal fan can be easily mounted, the centrifugal fan can be disposed between the first flat plate-shaped member and the second flat plate-shaped member.

DETAILED DESCRIPTION

Figure 1:
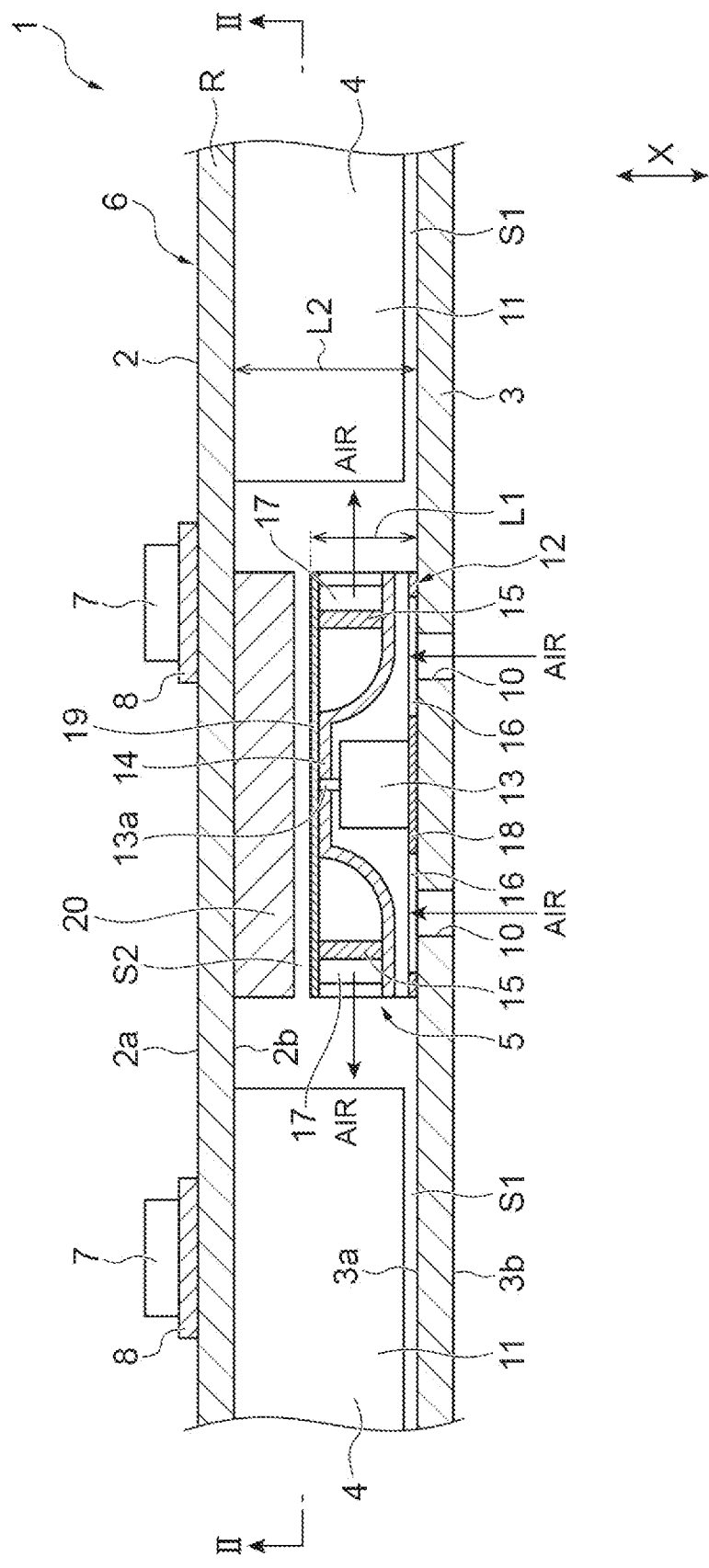
FIG. 1 is a vertical cross-sectional view showing a cooling device according to a first embodiment of the present disclosure.

Hereinafter, embodiments of the present disclosure will be described in detail with reference to the drawings. In the drawings, the same or equivalent elements are designated by the same reference numerals, and duplicate description thereof will be omitted.

Figure 2:
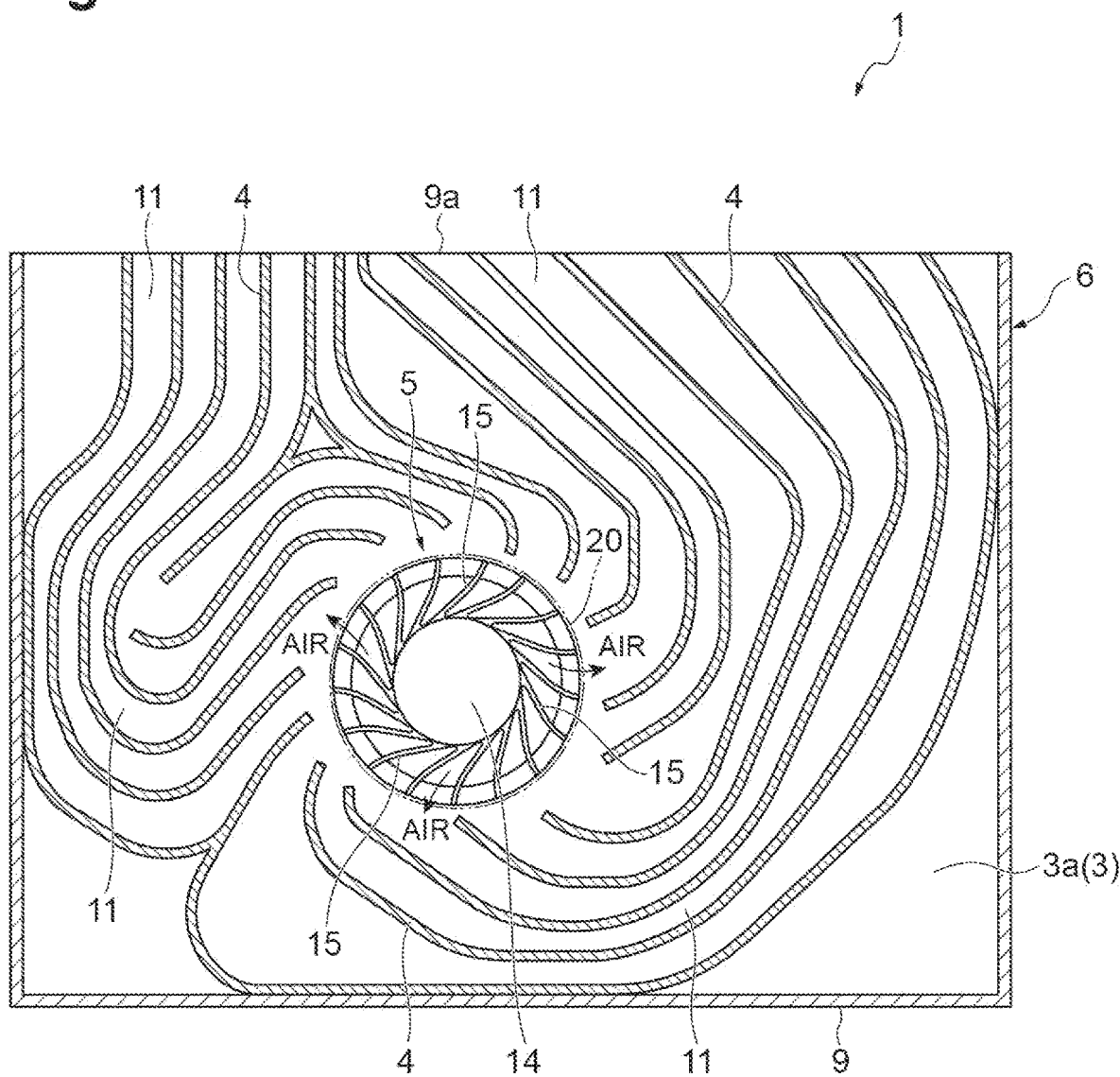
FIG. 2 is a cross-sectional view along line II-II of FIG. 1.

FIG. 1 is a vertical cross-sectional view showing a cooling device according to a first embodiment of the present disclosure. FIG. 2 is a cross-sectional view along line II-II of FIG. 1. In FIGS. 1 and 2, the cooling device 1 of the present embodiment is used for cooling an electronic device such as an AC inverter mounted in a vehicle, for example.

The cooling device 1 includes a heat sink 6, a heat radiation fin 4, and a centrifugal fan 5. The cooling device 1 is a device for cooling an electronic component 7 to be cooled.

The heat sink 6 of the present embodiment has an upper flat plate-shaped member 2 (a first flat plate-shaped member), a lower flat plate-shaped member 3 (a second flat plate-shaped member), and four side walls 9 connected to the upper flat plate-shaped member 2 and the lower flat plate-shaped member 3.

The upper flat plate-shaped member 2 and the lower flat plate-shaped member 3 are disposed to face each other with a certain interval therebetween. The upper flat plate-shaped member 2 and the lower flat plate-shaped member 3 have a rectangular shape in a plan view, for example. The side walls 9 are connected to outer peripheral edges of the upper flat plate-shaped member 2 and outer peripheral edges of the lower flat plate-shaped member 3. A side wall hole 9a is provided as a through hole in one of the four side walls 9. The side walls 9 determine a distance between the upper flat plate-shaped member 2 and the lower flat plate-shaped member 3.

A plurality of electronic components 7 are fixed to an outer main surface 2a of the upper flat plate-shaped member 2 with a heat transfer material 8 interposed therebetween. The electronic components 7 are semiconductor elements or the like that easily generate heat. The heat generated in the electronic components 7 is transferred to the upper flat plate-shaped member 2 through a heat transfer material 8. The outer main surface 2a of the upper flat plate-shaped member 2 is a main surface of the upper flat plate-shaped member 2 on the side opposite to the lower flat plate-shaped member 3. An inner main surface 2b of the upper flat plate-shaped member 2 is a main surface of the upper flat plate-shaped member 2 on the lower flat plate-shaped member 3 side, and is a surface that defines the inside of the heat sink 6. The upper flat plate-shaped member 2 is made of a metal material such as aluminum, for example.

An inner main surface 3a of the lower flat plate-shaped member 3 is a main surface of the lower flat plate-shaped member 3 on the upper flat plate-shaped member 2 side, and is a surface that defines the inside of the heat sink 6. An outer main surface 3b of the lower flat plate-shaped member 3 is a main surface of the lower flat plate-shaped member 3 on the side opposite to the upper flat plate-shaped member 2. The lower flat plate-shaped member 3 is made of a metal material such as iron, for example. A communication port 10 that is a through hole is provided in the vicinity of a central portion of the lower flat plate-shaped member 3.

A plurality of heat radiation fins 4 extend from the upper flat plate-shaped member 2 toward the lower flat plate-shaped member 3. The heat radiation fins 4 form a flow path 11 through which air flows between the upper flat plate-shaped member 2 and the lower flat plate-shaped member 3 (inside the heat sink 6). A slight gap S1 is present between a tip end of the heat radiation fin 4 (an end of the heat radiation fin 4 on the inner main surface 3a side of the lower flat plate-shaped member 3) and the inner main surface 3a of the lower flat plate-shaped member 3. The tip end of the heat radiation fin 4 and the inner main surface 3a of the lower flat plate-shaped member 3 may be in contact with each other.

The plurality of heat radiation fins 4 extend from the vicinity of a protruding part 20, which will be described later, in the upper flat plate-shaped member 2 toward the side wall hole 9a and also extend so that the flow path 11 communicates with the side wall hole 9a. Thus, the air inside the heat sink 6 flows through the flow path 11 and is discharged to the outside of the heat sink 6 from the side wall hole 9a. The heat radiation fin 4 of the present embodiment has a shape having a bent portion so that a portion on which the electronic component 7 is placed can be efficiently cooled. FIG. 1 is a vertical cross-sectional view along the flow path 11.

The centrifugal fan 5 has a motor 13, an impeller 14 connected to an output shaft 13a of the motor 13, and an accommodation part 12 that accommodates the motor 13 and the impeller 14. The impeller 14 is configured of a plurality of blades 15. An axial direction of the output shaft 13a of the motor 13 (an axial direction of the centrifugal fan 5) corresponds to an arrangement direction (an X direction) of the upper flat plate-shaped member 2 and the lower flat plate-shaped member 3.

The accommodation part 12 is configured of a pair of flat plate-shaped members 18 and 19 disposed to face each other with a certain interval, and a partition wall (not shown) that connects the flat plate-shaped members 18 and 19. An inlet 16 as an opening that passes through the flat plate-shaped member 18 and an outlet 17 that passes through the partition wall are formed in the accommodation part 12. That is, the outlet 17 is open in a direction intersecting an opening direction of the inlet 16. The inlet 16 may also be provided in the flat plate-shaped member 19.

The centrifugal fan 5 is fixed to the inner main surface 3a of the lower flat plate-shaped member 3 at a position separated from the upper flat plate-shaped member 2 by a predetermined distance so that the outlet 17 opens toward the flow path 11. The centrifugal fan 5 of the present embodiment is fixed to the inner main surface 3a of the lower flat plate-shaped member 3 so that the communication port 10 and the inlet 16 communicate with each other. Therefore, the centrifugal fan 5 of the present embodiment is disposed between the upper flat plate-shaped member 2 and the lower flat plate-shaped member 3.

In the centrifugal fan 5, the impeller 14 rotates as the motor 13 rotates, and air is taken into the accommodation part 12 (inside the centrifugal fan 5) from the communication port 10 and the inlet 16. The air taken into the accommodation part 12 is pushed out by the impeller 14 and is discharged from the outlet 17. The outlet 17 is open toward the flow path 11. Therefore, the air discharged from the outlet 17 flows into the flow path 11.

A length L1 of the centrifugal fan 5 in the axial direction is shorter than a shortest distance L2 between the inner main surface 2b of a fin forming portion R provided with the heat radiation fins 4 in the upper flat plate-shaped member 2 and the inner main surface 3a of the lower flat plate-shaped member 3.

A protruding part 20 that protrudes toward the centrifugal fan 5 is provided on the upper flat plate-shaped member 2. In other words, the protruding part 20 is provided on the upper flat plate-shaped member 2 which is farther from the centrifugal fan 5 among the upper flat plate-shaped member 2 and the lower flat plate-shaped member 3. The protruding part 20 of the present embodiment is provided at a portion of the inner main surface 2b of the upper flat plate-shaped member 2 that faces the centrifugal fan 5.

The protruding part 20 of the present embodiment has a cylindrical shape. That is, the protruding part 20 has a circular shape in a plan view. A diameter of the protruding part 20 may be, for example, the same as a diameter of the centrifugal fan 5, or may be larger or smaller than the diameter of the centrifugal fan 5. That is, a size and a shape of the protruding part 20 are not particularly limited as long as the protruding part 20 can suppress a wraparound of air as compared with a case in which the protruding part 20 is not provided.

A slight gap S2 is provided between a tip end (an end of the protruding part 20 on the side opposite to the inner main surface 2b side (a base end side of the protruding part 20) of the upper flat plate-shaped member 2) of the protruding part 20 and the centrifugal fan 5. The tip end of the protruding part 20 and the centrifugal fan 5 may be in contact with each other.

The protruding part 20 may be formed of the same metal material as the upper flat plate-shaped member 2, or may be formed of a different metal material. The protruding part 20 may be formed of a heat-resistant resin or the like.

In the cooling device 1 as described above, when the impeller 14 is rotated by driving the motor 13 of the centrifugal fan 5 to rotate, the air outside the cooling device 1 is taken into the inside of the centrifugal fan 5 from the communication port 10 and the inlet 16. The air taken into the centrifugal fan 5 is pushed out by the impeller 14 and is discharged from the outlet 17. The air discharged from the outlet 17 flows into the flow path 11, flows through the flow path 11, and is discharged from the side wall hole 9a of the side wall 9 to the outside of the heat sink 6. Thus, the heat sink 6 is cooled, and the electronic component 7 is cooled.

Figure 3:
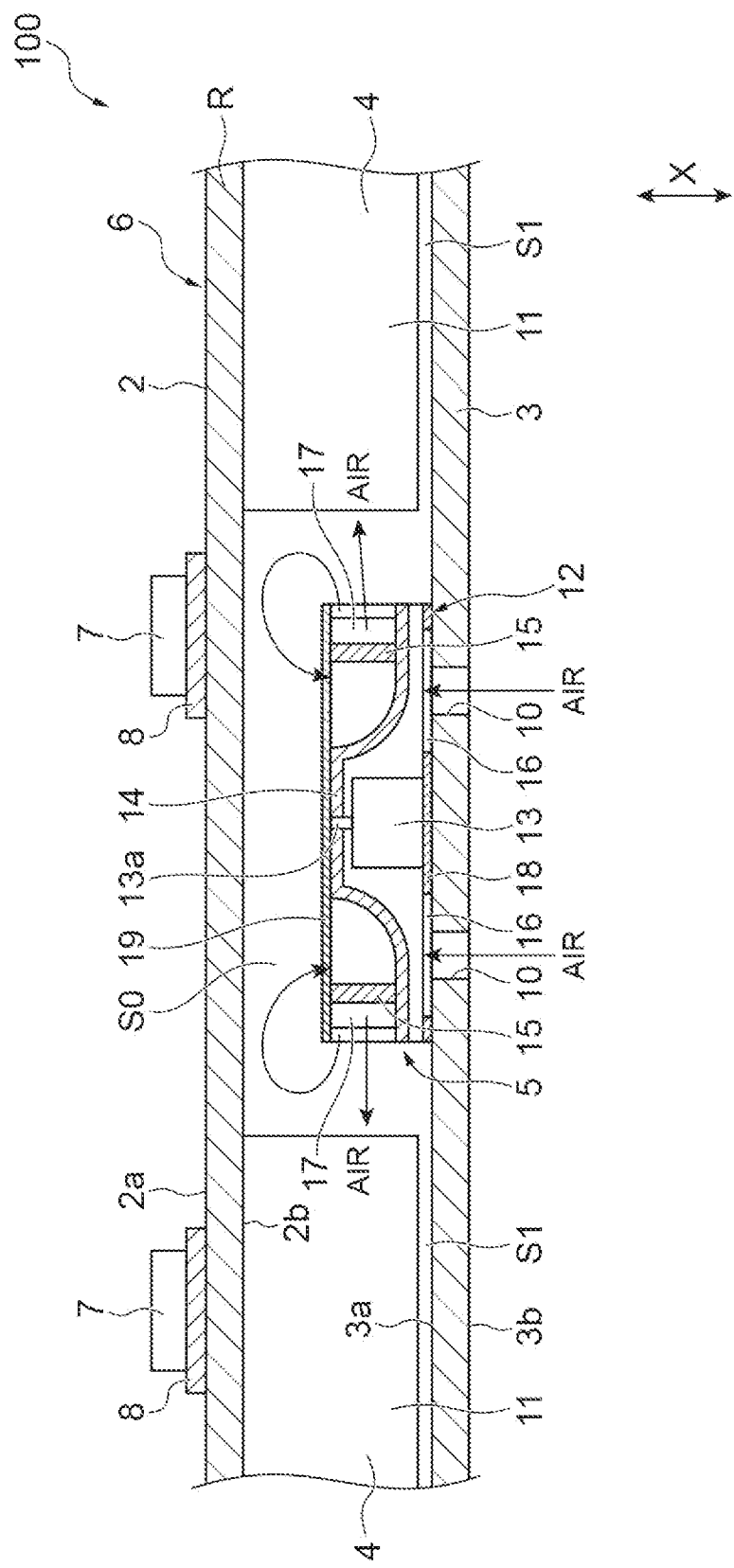
FIG. 3 is a vertical cross-sectional view showing a cooling device as a comparative example.

FIG. 3 is a vertical cross-sectional view showing a cooling device as a comparative example. In FIG. 3, the cooling device 100 of this comparative example is different from the above-described first embodiment in that there is no protruding part 20. The other configuration of the cooling device 100 is the same as that of the above-described first embodiment.

In the cooling device 100 of this comparative example, there is a large gap S0 between the centrifugal fan 5 and the inner main surface 2b of the upper flat plate-shaped member 2. Therefore, some of the air flowing out of the outlet 17 of the centrifugal fan 5 intrudes into the gap S0. When the wraparound of air into the gap S0 occurs, the air warmed by the electronic component 7 which is a heating element is not discharged from the inside of the heat sink 6 and circulates inside the heat sink 6. Further, when the wraparound of air into the gap S0 occurs, an amount of air flowing through the flow path 11 decreases, and a flow rate of the air decreases. As a result, the cooling capacity of the cooling device 100 is reduced.

In order to solve the above problems and to realize miniaturization of the cooling device, it is conceivable to select a centrifugal fan 5 having a size suitable for a size of the heat sink 6, but it is very difficult to select the centrifugal fan 5 having an appropriate size for each heat sink 6.

To solve such a problem, in the present embodiment, the protruding part 20 that protrudes toward the centrifugal fan 5 is provided on the upper flat plate-shaped member 2. Therefore, the gap between the centrifugal fan 5 and the upper flat plate-shaped member 2 is narrowed by the protruding part 20, and the air flowing out of the outlet 17 of the centrifugal fan 5 is less likely to enter the gap between the centrifugal fan 5 and the upper flat plate-shaped member 2. Therefore, the circulation of air in the cooling device 1 is suppressed, and the amount of air flowing through the flow path 11 and the flow rate of the air increase. Therefore, for example, even when the length L1 of the centrifugal fan 5 in the axial direction is short, the cooling of the heat sink 6 can be efficiently performed. Thus, the centrifugal fan 5 can be easily selected, and the cooling capacity of the cooling device 1 is improved.

In the present embodiment, the protruding part 20 is provided on the upper flat plate-shaped member 2. Therefore, the air flowing out of the outlet 17 of the centrifugal fan 5 is less likely to enter the gap between the centrifugal fan 5 and the upper flat plate-shaped member 2.

In the present embodiment, the centrifugal fan 5 is mounted on the lower flat plate-shaped member 3. Therefore, the centrifugal fan 5 can be disposed between the upper flat plate-shaped member 2 and the lower flat plate-shaped member 3 while the centrifugal fan 5 is easily mounted.

In the present embodiment, the communication port 10 that communicates with the inlet 16 of the centrifugal fan 5 is provided in the lower flat plate-shaped member 3. Therefore, since the air flows into the centrifugal fan 5 through the communication port 10 and the inlet 16, the air around the cooling device 1 is smoothly taken into the centrifugal fan 5.

Figure 4:
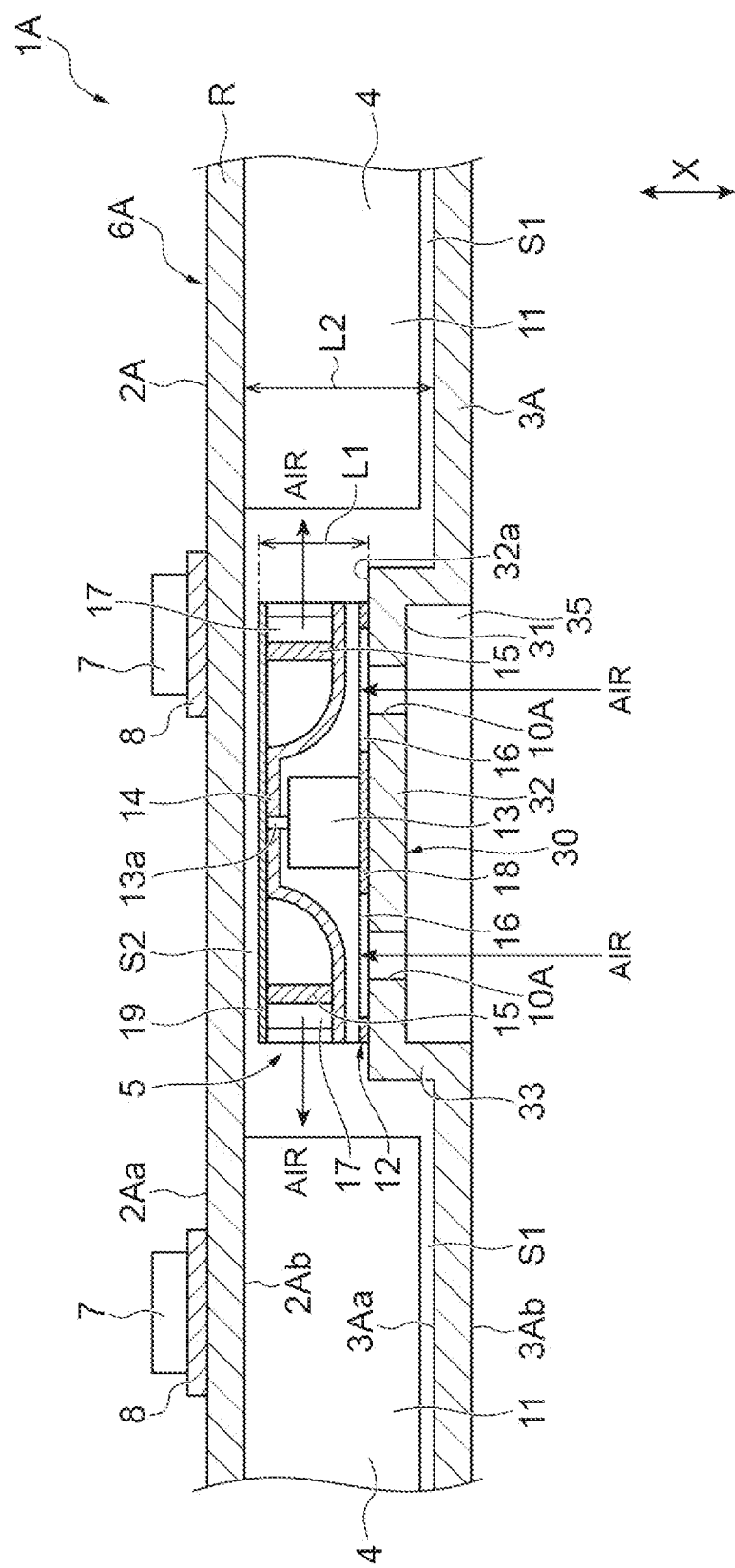
FIG. 4 is a vertical cross-sectional view showing a cooling device according to a second embodiment of the present disclosure.

FIG. 4 is a vertical cross-sectional view showing a cooling device according to a second embodiment of the present disclosure. In FIG. 4, the cooling device 1A of the present embodiment includes a heat sink 6A and the centrifugal fan 5 described above.

The heat sink 6A has an upper flat plate-shaped member 2A (a first flat plate-shaped member), a lower flat plate-shaped member 3A (a second flat plate-shaped member), a side wall 9 (refer to FIG. 2) connected to the upper flat plate-shaped member 2A and the lower flat plate-shaped member 3A, and the heat radiation fins 4 described above.

The configuration of the upper flat plate-shaped member 2A is the same as that of the upper flat plate-shaped member 2 in the above-described first embodiment. The protruding part 20 according to the first embodiment is not provided on the upper flat plate-shaped member 2A. An outer main surface 2Aa of the upper flat plate-shaped member 2A is a main surface of the upper flat plate-shaped member 2A on the side opposite to the lower flat plate-shaped member 3A. An inner main surface 2Ab of the upper flat plate-shaped member 2A is a main surface of the upper flat plate-shaped member 2A on the lower flat plate-shaped member 3A side, and is a surface that defines the inside of the heat sink 6A.

The lower flat plate-shaped member 3A is different from the lower flat plate-shaped member 3 in the above-described first embodiment in that it has a through hole 35 instead of the communication port 10. An inner main surface 3Aa of the lower flat plate-shaped member 3A is a main surface of the lower flat plate-shaped member 3A on the upper flat plate-shaped member 2A side and is a surface that defines the inside of the heat sink 6A. An outer main surface 3Ab of the lower flat plate-shaped member 3A is a main surface of the lower flat plate-shaped member 3A on the side opposite to the upper flat plate-shaped member 2A. A protruding part 30 that protrudes toward the centrifugal fan 5 is provided on the lower flat plate-shaped member 3A.

The protruding part 30 has a bottomed cylindrical shape. The protruding part 30 is configured of a tubular portion 33 that has a cylindrical shape and extends from an outer peripheral edge of the through hole 35 for defining the through hole 35 of the lower flat plate-shaped member 3A toward the upper flat plate-shaped member 2A, and a circular bottom portion 32 provided at an end portion of the tubular portion 33 on the upper flat plate-shaped member 2A side. A communication port 10A that is a through hole is provided in the bottom portion 32.

The lower flat plate-shaped member 3A and the protruding part 30 of the present embodiment are integrally formed by, for example, press working. The protruding part 30 is provided on the lower flat plate-shaped member 3A that is farther from the centrifugal fan 5 among the upper flat plate-shaped member 2A and the lower flat plate-shaped member 3A.

A diameter of the bottom portion 32 may be, for example, the same as the diameter of the centrifugal fan 5, or may be larger or smaller than the diameter of the centrifugal fan 5. That is, a size and a shape of the protruding part 30 are not particularly limited as long as the protruding part 30 can suppress the wraparound of air as compared with a case in which the protruding part 30 is not provided.

The centrifugal fan 5 is fixed to the inner main surface 32a of the bottom portion 32 at a position separated from the lower flat plate-shaped member 3A by a predetermined interval so that the outlet 17 is open toward the flow path 11. The centrifugal fan 5 of the present embodiment is fixed to an inner main surface 32a of the bottom portion 32 so that the communication port 10A and the inlet 16 communicate with each other. Therefore, the centrifugal fan 5 of the present embodiment is disposed between the upper flat plate-shaped member 2A and the lower flat plate-shaped member 3A.

The length L1 of the centrifugal fan 5 in the axial direction is shorter than the shortest distance L2 between the inner main surface 2Ab of a fin forming portion R provided with the heat radiation fins 4 in the upper flat plate-shaped member 2A and the inner main surface 3Aa of the lower flat plate-shaped member 3A.

A slight gap S2 is provided between the centrifugal fan 5 and the inner main surface 2Ab of the upper flat plate-shaped member 2A. The centrifugal fan 5 and the inner main surface 2Ab of the upper flat plate-shaped member 2A may be in contact with each other.

In the present embodiment, the protruding part 30 that protrudes toward the centrifugal fan 5 is provided on the lower flat plate-shaped member 3A. Therefore, the gap between the centrifugal fan 5 and the upper flat plate-shaped member 2A is narrowed by the protruding part 30, and the air flowing out of the outlet 17 of the centrifugal fan 5 is less likely to enter the gap between the centrifugal fan 5 and the upper flat plate-shaped member 2A. Thus, as in the above-described first embodiment, the centrifugal fan 5 can be easily selected, and the cooling capacity of the cooling device 1A is improved.

In the present embodiment, the protruding part 30 is provided on the lower flat plate-shaped member 3. Therefore, the air flowing out of the outlet 17 of the centrifugal fan 5 is less likely to enter the gap between the centrifugal fan 5 and the upper flat plate-shaped member 2A.

In the present embodiment, the centrifugal fan 5 is mounted on the protruding part 30. Therefore, the centrifugal fan 5 can be disposed between the upper flat plate-shaped member 2A and the lower flat plate-shaped member 3A while the centrifugal fan 5 is easily mounted.

The present disclosure is not limited to the above-described embodiments. For example, in the above-described first embodiment, although the protruding part 20 of the upper flat plate-shaped member 2 is a separate body from the upper flat plate-shaped member 2, the present disclosure is not particularly limited thereto, and the upper flat plate-shaped member 2 and the protruding part 20 may be integrally formed.

In the above-described second embodiment, the protruding part 30 of the lower flat plate-shaped member 3A is integrally formed with the lower flat plate-shaped member 3A, but the present disclosure is not particularly limited thereto, and the lower flat plate-shaped member 3A and the protruding part 30 may be separate bodies.

In the above-described first embodiment, although the protruding part 20 is provided only on the upper flat plate-shaped member 2, the protruding part 20 may be provided on at least the upper flat plate-shaped member 2 which is farther from the centrifugal fan 5 among the upper flat plate-shaped member 2 and the lower flat plate-shaped member 3, and may be provided on both the upper flat plate-shaped member 2 and the lower flat plate-shaped member 3. When the protruding part 20 is provided on both the upper flat plate-shaped member 2 and the lower flat plate-shaped member 3, the centrifugal fan 5 is provided at a position separated from both the upper flat plate-shaped member 2 and the lower flat plate-shaped member 3 by a predetermined distance. The same applies to the above-described second embodiment.

Although the protruding part 20 of the above-described first embodiment has a cylindrical shape, the shape of the protruding part 20 is not particularly limited as long as it protrudes toward the centrifugal fan 5 and can suppress the wraparound of air into the gap between the centrifugal fan 5 and the upper flat plate-shaped member 2, and can be variously changed. Although the protruding part 30 of the above-described second embodiment has the bottomed cylindrical shape, the shape of the protruding part 30 is not particularly limited as long as it protrudes toward the centrifugal fan 5 and can suppress the wraparound of air into the gap between the centrifugal fan 5 and the upper flat plate-shaped member 2, and can be variously changed.

For example, the shape of the protruding part 20 of the first embodiment may be a cylindrical shape or a bottomed tubular shape. Even in this case, since the gap between the tip end of the protruding part 20 and the centrifugal fan 5 is narrowed, air is less likely to enter the gap between the upper flat plate-shaped member 2 and the centrifugal fan 5. The protrusion of the protruding part toward the centrifugal fan 5 means that at least a part of the protruding part on the tip end side with respect to the base end portion of the upper flat plate-shaped member 2 protrudes toward the centrifugal fan 5. A distance from the centrifugal fan 5 may be shorter in a portion of the protruding part on the base end side than in a portion thereof on the tip end side.

In the above-described first embodiment, although the centrifugal fan 5 is disposed in the vicinity of a central portion of the upper flat plate-shaped member 2 and the lower flat plate-shaped member 3, an arrangement location of the centrifugal fan 5 is not particularly limited thereto, and may be, for example, in the vicinity of outer peripheral edges of the upper flat plate-shaped member 2 and the lower flat plate-shaped member 3. The same applies to the above-described second embodiment.

In the above-described first embodiment, although the entire centrifugal fan 5 is disposed between the upper flat plate-shaped member 2 and the lower flat plate-shaped member 3, the present disclosure is not particularly limited thereto, and a part of the centrifugal fan 5 may protrude from the upper flat plate-shaped member 2 and the lower flat plate-shaped member 3. That is, a part of the centrifugal fan 5 may not be disposed between the upper flat plate-shaped member 2 and the lower flat plate-shaped member 3. The same applies to the above-described second embodiment.

In the above-described first embodiment, although the centrifugal fan 5 is fixed to the lower flat plate-shaped member 3, the present disclosure is not particularly limited thereto. The centrifugal fan 5 may be disposed at a position separated from at least one of the upper flat plate-shaped member 2 and the lower flat plate-shaped member 3 by a predetermined interval so that the outlet 17 is open toward the flow path 11. For example, the centrifugal fan 5 may be fixed to another component other than the heat sink 6.

In the above-described second embodiment, although the centrifugal fan 5 is fixed to the inner main surface 32a of the bottom portion 32, the present disclosure is not particularly limited thereto. The centrifugal fan 5 may be disposed at a position separated from at least one of the upper flat plate-shaped member 2A and the lower flat plate-shaped member 3A by a predetermined interval so that the outlet 17 is open toward the flow path 11. For example, the centrifugal fan 5 may be fixed to another component other than the heat sink 6A.

In the above-mentioned first embodiment, although the electronic component 7 is mounted on the upper flat plate-shaped member 2, the present disclosure is not particularly limited thereto, and the electronic component 7 may be mounted on the lower flat plate-shaped member 3, or the electronic component 7 may be mounted on the upper flat plate-shaped member 2 and the lower flat plate-shaped member 3. The same applies to the above-described second embodiment.

In the above-described first embodiment, although the heat sink 6 has the side wall 9, the present disclosure is not particularly limited thereto, and the heat sink 6 may not have the side wall 9. For example, a configuration in which the upper flat plate-shaped member 2 and the lower flat plate-shaped member 3 are joined to the heat radiation fins 4 can be considered. Further, for example, a configuration in which the upper flat plate-shaped member 2 and the lower flat plate-shaped member 3 are fixed to another component other than the heat sink 6 can be considered. The same applies to the above-described second embodiment.

In the above-described first embodiment, although the length of the centrifugal fan 5 in the axial direction is shorter than the shortest distance L2 between the inner main surface 2b of the fin forming portion R provided with the heat radiation fins 4 in the upper flat plate-shaped member 2 and the inner main surface 3a of the lower flat plate-shaped member 3, the present disclosure is not limited thereto. The same applies to the above-described second embodiment.

Although the cooling devices 1 and 1A of the above-described embodiments are applied to electronic devices for vehicles, the present disclosure is also applicable to electronic devices other than those for vehicles.

What is claimed is:

1. A cooling device comprising:
a first flat plate-shaped member and a second flat plate-shaped member disposed with a predetermined interval therebetween;
a heat radiation fin configured to extend from the first flat plate-shaped member toward the second flat plate-shaped member and to form a flow path through which air flows between the first flat plate-shaped member and the second flat plate-shaped member; and
a centrifugal fan having an inlet as an opening, an outlet configured to be open in a direction intersecting an opening direction of the inlet, and an impeller that rotates so that air taken in through the inlet is pushed out the outlet by the impeller,
wherein the centrifugal fan is disposed at a position separated from at least one of the first flat plate-shaped member and the second flat plate-shaped member by a predetermined interval so that the outlet is open toward the flow path, and
wherein a protruding part that protrudes toward the centrifugal fan is provided on a portion of at least one of the first flat plate-shaped member and the second flat plate-shaped member that is farther from the centrifugal fan, wherein the portion faces the centrifugal fan and the protruding part overlaps with the impeller of the centrifugal fan in an axial direction in a vertical cross-sectional view of the cooling device.

2. The cooling device according to claim 1, wherein the protruding part is provided on the first flat plate-shaped member.

3. The cooling device according to claim 2, wherein the centrifugal fan is mounted on the second flat plate-shaped member.

4. The cooling device according to claim 1, wherein the protruding part is provided on the second flat plate-shaped member.

5. The cooling device according to claim 4, wherein the centrifugal fan is mounted on the protruding part.

6. The cooling device according to claim 1, wherein the first flat plate-shaped member or the second flat plate-shaped member comprises a communication port in a portion corresponding to the inlet of the centrifugal fan.

7. The cooling device according to claim 1, further comprising an object to be cooled disposed on an outer main surface of the first flat plate-shaped member.

8. The cooling device according to claim 1, wherein a length of the centrifugal fan in the axial direction is less than an axial distance of a downstream-side of the flow path that is provided with the heat radiation fin, and
wherein a sum of the length of the centrifugal fan in the axial direction and a length of the protruding part in the axial direction is less than the axial distance of the downstream-side of the flow path that is provided with the heat radiation fin.

9. The cooling device according to claim 1, wherein the centrifugal fan and the protruding part each have a circular shape in a plan view, and
wherein a diameter of the protruding part is greater than or equal to a diameter of the centrifugal fan.

10. The cooling device according to claim 1, wherein the centrifugal fan and the protruding part each have a circular shape in a plan view, and
wherein a diameter of the protruding part is less than or equal to a diameter of the centrifugal fan.

11. The cooling device according to claim 1, wherein a center of the protruding part is aligned with a center of the centrifugal fan in the axial direction.

12. The cooling device according to claim 1, wherein a first tip end of the heat radiation fin directly contacts an inner surface of the first flat plate-shaped member and extends from the inner surface of the first flat plate-shaped member toward the second flat plate-shaped member, and the flow path through which air flows through the heat radiation fin is defined in the axial direction by the inner surface of the first flat plate-shaped member and an inner surface of the second flat plate-shaped member.

* * * * *